United States Patent
Dai et al.

(10) Patent No.: US 7,737,533 B2
(45) Date of Patent: Jun. 15, 2010

(54) LOW VOLTAGE TRANSIENT VOLTAGE SUPPRESSOR WITH TAPERED RECESS EXTENDING INTO SUBSTRATE OF DEVICE ALLOWING FOR REDUCED BREAKDOWN VOLTAGE

(75) Inventors: Sheng-Huei Dai, Hsinchu (TW);
Ya-Chin King, Hsinchu (TW);
Hai-Ning Wang, Hsin Tien (TW);
Ming-Tai Chiang, Hsin Tien (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 0 days.

(21) Appl. No.: 11/827,463

(22) Filed: Jul. 11, 2007

(65) Prior Publication Data
US 2008/0036047 A1   Feb. 14, 2008

Related U.S. Application Data

(60) Provisional application No. 60/836,875, filed on Aug. 10, 2006.

(51) Int. Cl.
*H01L 29/26* (2006.01)

(52) U.S. Cl. ..................... 257/653; 438/673

(58) Field of Classification Search ............. 257/331, 257/341, 653; 438/673
See application file for complete search history.

(56) References Cited

U.S. PATENT DOCUMENTS

| | | | |
|---|---|---|---|
| 4,003,036 A | 1/1977 | Jenne | |
| 4,296,429 A | 10/1981 | Schroeder | |
| 4,375,124 A * | 3/1983 | Cogan | 438/192 |
| 4,379,305 A * | 4/1983 | Mitchell | 257/331 |
| 4,966,433 A * | 10/1990 | Blonder | 385/49 |
| 5,501,998 A * | 3/1996 | Chen | 438/396 |
| 6,365,932 B1 * | 4/2002 | Kouno et al. | 257/341 |
| 7,102,199 B2 | 9/2006 | Robb et al. | |

* cited by examiner

*Primary Examiner*—Thomas L Dickey
(74) *Attorney, Agent, or Firm*—Mayer & Williams PC; Stuart H. Mayer; Karin L. Williams

(57) ABSTRACT

A semiconductor junction device includes a substrate of low resistivity semiconductor material having a preselected polarity. A tapered recess extends into the substrate and tapers inward as it extends downward from an upper surface of the substrate. A semiconductor layer is disposed within the recess and extends above the upper surface of the substrate. The semiconductor layer has a polarity opposite from that of the substrate. A metal layer overlies the semiconductor layer.

9 Claims, 10 Drawing Sheets

LOW VOLTAGE TRANSIENT VOLTAGE SUPPRESSOR WITH TAPERED RECESS EXTENDING INTO SUBSTRATE OF DEVICE ALLOWING FOR REDUCED BREAKDOWN VOLTAGE

STATEMENT OF RELATED APPLICATIONS

This application claims the benefit of U.S. Provisional Patent Application Ser. No. 60/836,875, filed Aug. 10, 2006, entitled "V-Groove Application in Low Voltage TVS", which is incorporated by reference herein.

FIELD OF THE INVENTION

The present invention relates in general to Transient Voltage Suppression (TVS) devices and, more particularly, to low voltage TVS devices.

BACKGROUND OF THE INVENTION

Virtually all electronic devices are susceptible to transient perturbations such as electrostatic discharge or electromagnetically coupled interference. The perturbations often occur at the Input/Output (I/O) interfaces to the electronic devices. Typical examples of I/O interfaces susceptible to the transient perturbations, or signals, are power supply input terminals and data bus terminals to name only a few.

TVS junction diodes have typically been used to protect electronic devices from damage caused by transient voltage signals. TVS junction diodes placed into electronic devices for transient suppression are reverse biased under normal, non-transient conditions. During transient conditions, however, the reverse bias voltage exceeds the reverse breakdown voltage and the TVS junction diode clamps the transient voltage to be equal to the reverse breakdown voltage of the diode, thereby preventing the transient voltage from exceeding the maximum voltage that can be sustained by the electronic device.

Prior art TVS junction diodes perform well for high voltage (e.g., >5 volt) applications, but pose specific detrimental characteristics in low voltage (e.g., <5 volt) applications. The detrimental characteristics of low voltage TVS junction diodes include high breakdown voltages. Electronic devices today are designed to operate at battery supplied potentials below 5 volts, such as 3 volts and 1.8 volts or even lower. The current requirements of the battery operated circuits are being driven lower as well. Since the maximum voltage that many of these electronic devices can withstand is relatively low, it would be desirable to reduce the breakdown voltage so that the TVS junction diode clamps the transient voltage at lower levels.

SUMMARY OF THE INVENTION

In accordance with the present invention, a semiconductor junction device is provided. The device includes a substrate of low resistivity semiconductor material having a preselected polarity. A tapered recess extends into the substrate and tapers inward as it extends downward from an upper surface of the substrate. A semiconductor layer is disposed within the recess and extends above the upper surface of the substrate. The semiconductor layer has a polarity opposite from that of the substrate. A metal layer overlies the semiconductor layer.

In accordance with one aspect of the invention, the substrate comprises a silicon substrate.

In accordance with another aspect of the invention, the tapered recess is a V-groove.

In accordance with another aspect of the invention, the tapered recess is a V-groove.

In accordance with another aspect of the invention, the substrate has a [100] surface orientation.

In accordance with another aspect of the invention, the semiconductor layer comprises a polysilicon layer.

In accordance with another aspect of the invention, a method of forming a semiconductor junction device begins by forming a tapered recess in a substrate of low resistivity semiconductor material having a preselected polarity. The recess tapers inward as it extends downward from an upper surface of the substrate. A semiconductor layer is formed within the recess and extends above the upper surface of the substrate. The semiconductor layer has a polarity opposite from that of the substrate. A metal layer overlying the semiconductor layer is then formed.

DETAILED DESCRIPTION

Figure 1:
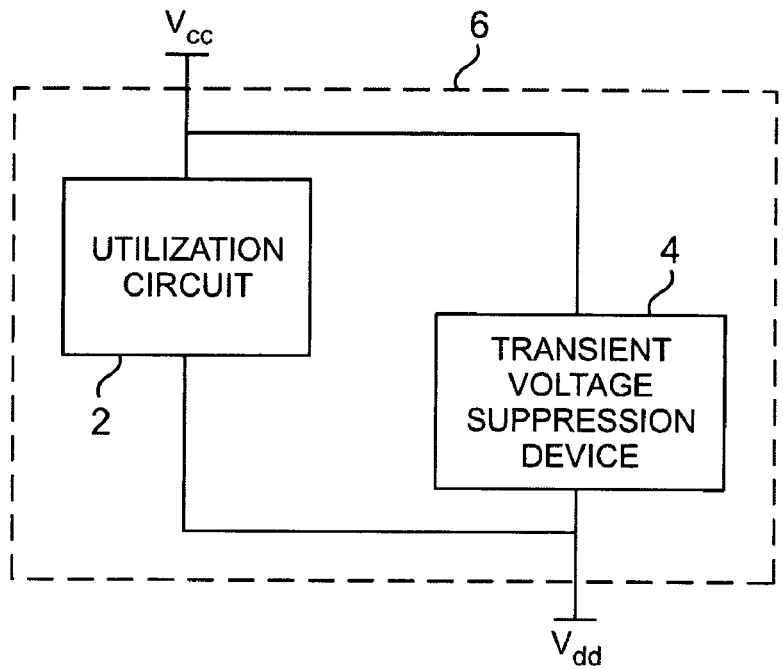
FIG. 1 shows a semiconductor junction device of the present invention utilized as a transient voltage suppressor (TVS) to isolate a circuit from voltage transients present on power supply terminals Vcc and Vdd.

In FIG. 1, an application of a TVS device 4 is illustrated whereby TVS device 4 isolates utilization circuit 2 from voltage transients present on power supply terminals Vcc and Vdd. TVS device 4 is effective to suppress both negative and positive transient potentials across utilization circuit 2. It should be noted, that various other applications exist for TVS device 4, such as a protection device used for I/O data lines and various other interfaces. Block 6 may denote an integrated circuit, for example, whereby utilization circuit 2 and TVS device 4 coexist on the same die. Conversely, block 6 may denote a printed circuit board, for example, whereby TVS device 4 is a discrete component providing protection to utilization circuit 2.

The present invention provides a low voltage TVS junction diode that has a breakdown voltage that can be reduced below that of conventional devices. A reduced breakdown voltage is achieved by enhancing the local electrical field in the vicinity of the p-n junction, which is located in the substrate. The enhanced local electrical field, in turn, increases the local current density. The local electrical field is increased by providing a sharp corner interface between the substrate and the overlying N+ poly layer. As detailed below, a tapered recess such as a V-shaped groove or the like is provided in the substrate to form the sharp corner interface.

Fabrication of a TVS device 200 in accordance with the present invention can be accomplished using semiconductor processing steps described below in connection with FIGS.

Figure 2:
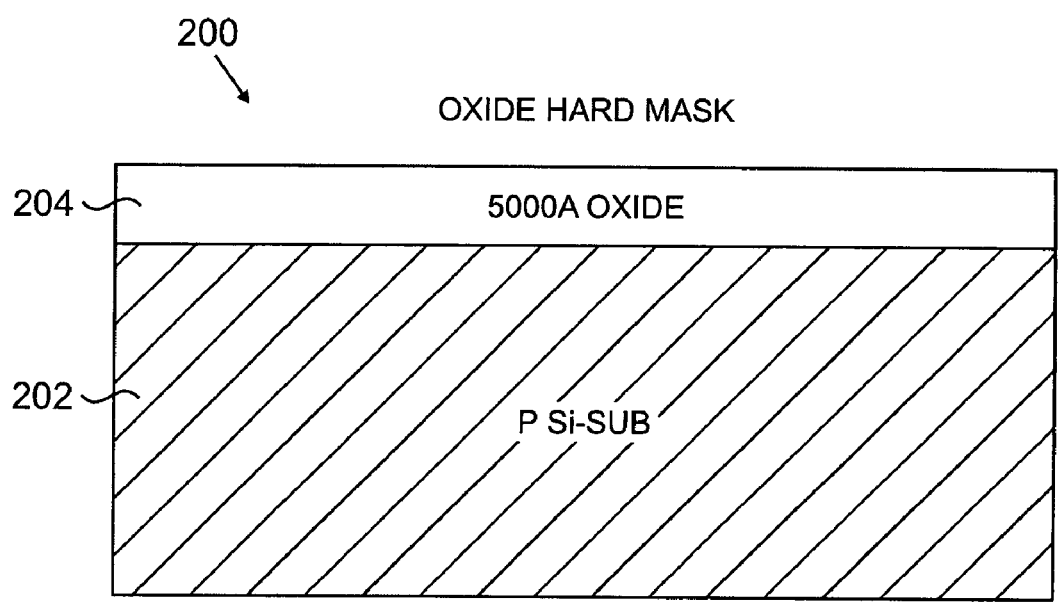
FIGS. 2-7 show one example of the semiconductor processing steps that may be used to fabricate a semiconductor junction device in accordance with the present invention.

2-7. As shown in FIG. 2, a wafer 202 of semiconductor material is selected having the desired characteristics, such as p-type crystalline silicon having a uniform thickness (e.g., 250 microns). In the embodiment of the invention illustrated, the starting material has a crystallographic orientation (such as 100 crystal plane material) such that V-type grooves or recesses can be formed therein by an anisotropic etchant. To form a first mask, the substrate is provided with a layer 204 of silicon dioxide which may be formed by oxidizing the substrate surface. In one embodiment the oxide layer 204 has a thickness of about 5000 angstroms.

Figure 3:
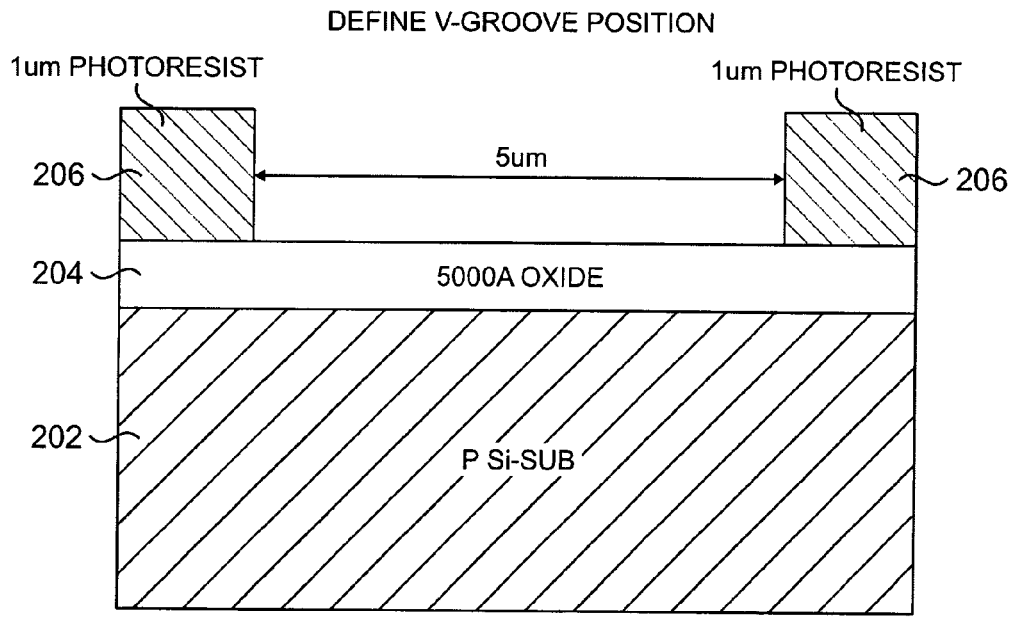
Figure 4:
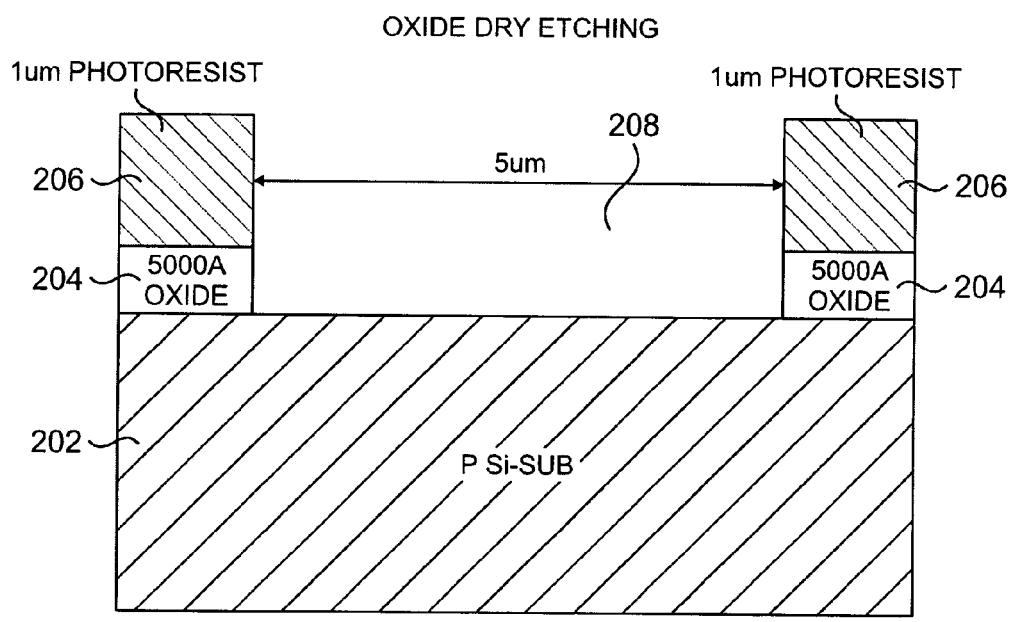
Figure 5:
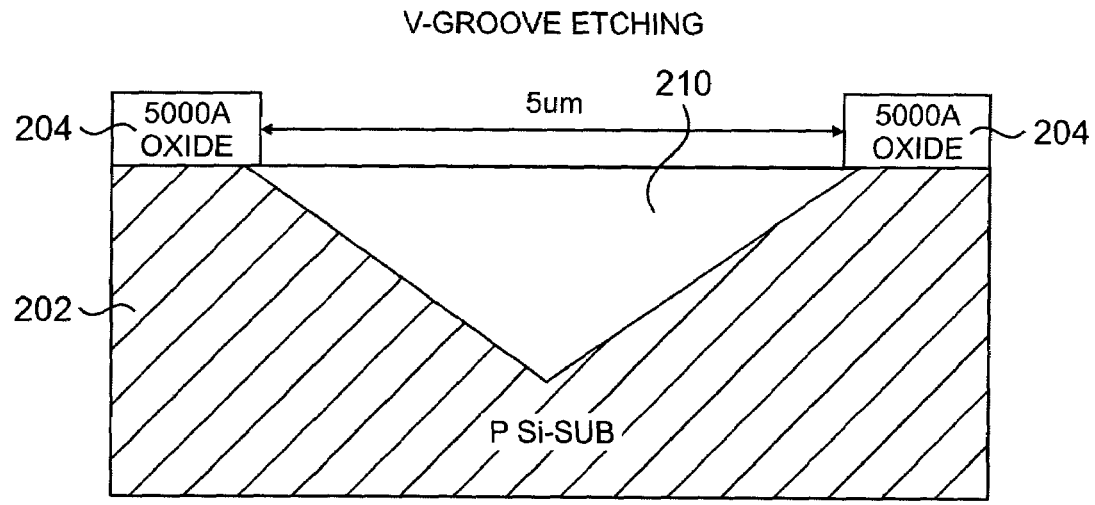
Figure 6:
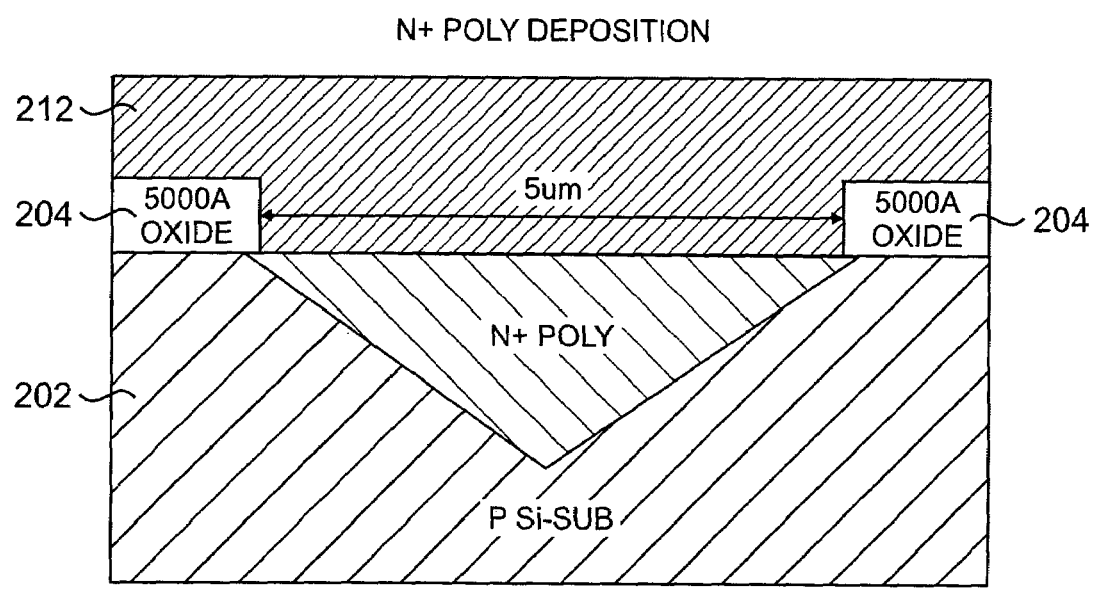

As shown in FIG. 3 a photoresist mask 206 is now used to form an aperture in which a V-type recess is to be formed. The aperture 208, shown in FIG. 4, in some embodiments may have a width of about 5 microns along the surface of the substrate 202. In FIG. 5 the photoresist 206 is removed and the V-type recess 210 is formed. The V-type recess 210 may be formed using an anisotropic etchant (e.g. hydrazine and water). The bottom of the recess 210 may extend to a depth of about 1-10 um into the substrate 202. Next, in FIG. 6, a heavily doped N+ polysilicon layer 212 is deposited using conventional techniques. The polysilicon layer 212 fills the V-type recess 210 and covers the oxide layer 204. The polysilicon layer 212 may have a thickness of about 1-10 um above the surface of the substrate 202.

In some embodiments of the invention the N+ polysilicon layer 212 may be formed by first depositing a layer of undoped polysilicon. A suitable dopant material (e.g., phosphorus, arsenic) is implanted into the undoped polysilicon layer. Regardless of whether the N+ polysilicon is deposited in this manner or in situ, a subsequent anneal process is used to diffuse or drive-in the dopant into the substrate 202. In the way the p-n junction will be located in the substrate rather than at the polysilicon/substrate interface, thereby preventing interface states from affecting the leakage current from the p/n junction.

Figure 7:
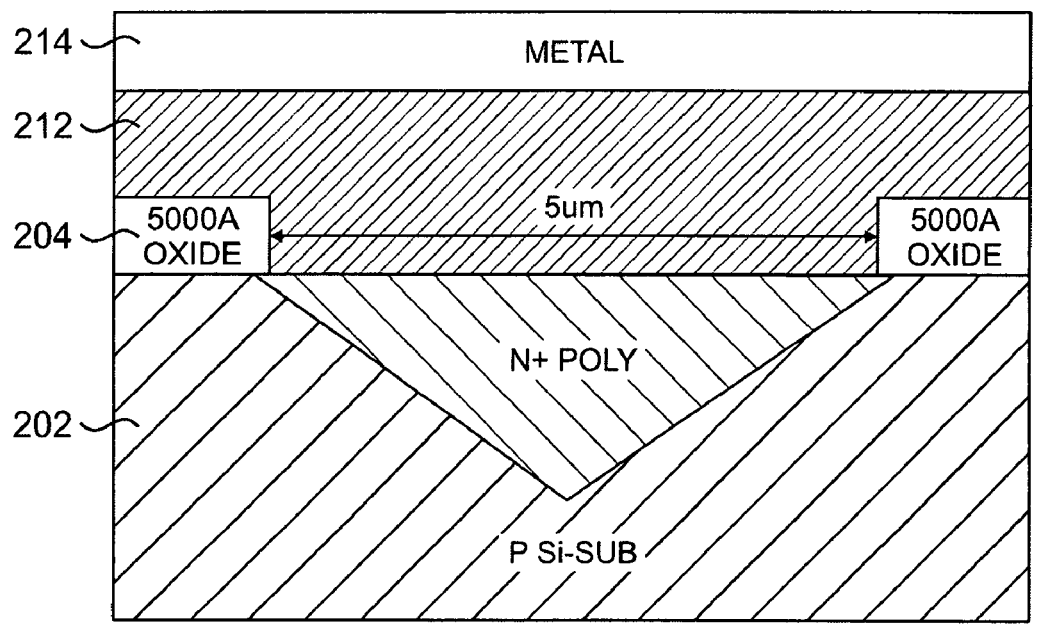

Next, in FIG. 7 a metal layer 214 is formed over the polysilicon layer 212. The metal layer 214 may be any appropriate metal such as, for instance, Al. The metal layer serves an anode. A metal layer is also formed on the backside of substrate to function as a cathode electrode.

The foregoing describes one series of method steps for making a semiconductor junction device according to the invention. However, other methods or variations of the aforesaid method could be employed. For example, a selective oxidation type of process using silicon nitride ($Si_3N_4$) layers as an etch and oxidation barrier may be used to give substantially the same structure. Also, additional masks may be provided to form additional features or structures in or on the device. In addition, a passivation layer may be provided on top of the metal anode in the conventional manner to help protect the device and preserve its structural and electrical integrity.

In the particular embodiment of the invention described above the substrate was selected to have a surface in the [100] plane. By providing such an orientation, a truncated V-shaped groove can be anisotropically etched therein. The advantage of this orientation is that the initial etch will have a truncated V-shaped and the subsequent etching step will continue removing the region below the original truncated V-shaped groove to form a substantially V-shaped recess. This type of etching produces substantially no side etching relative to the original groove walls. Although FIG. 5 illustrates formation of a V-shaped recess 210, the recess 210 may be formed to have other tapered shapes as well, provided that the tapered shape is sufficient to enhance the local electric field in the substrate 202 at the bottom of the recess 210 so that the breakdown voltage of the device is decreased. In these cases it may be desirable to provide a substrate with a different surface orientation than the [100] plane.

Figure 8:
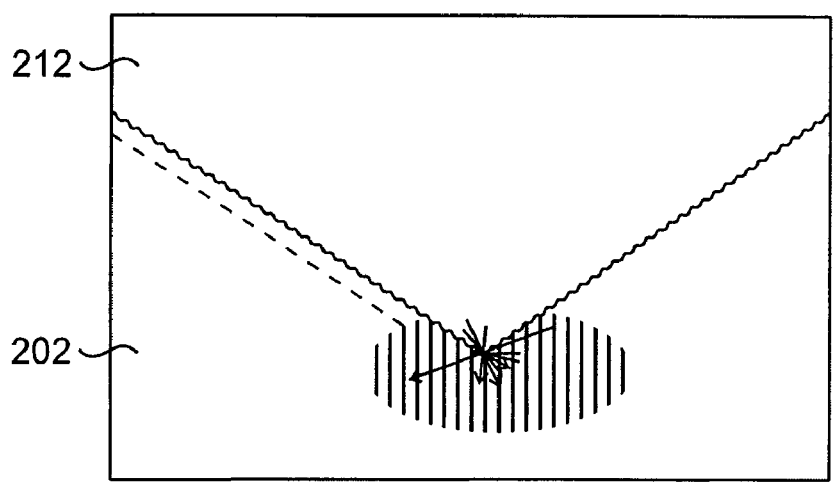
FIG. 8 is a simulation of the current distribution at the bottom of the groove showing an increase in current density.
Figure 9A:
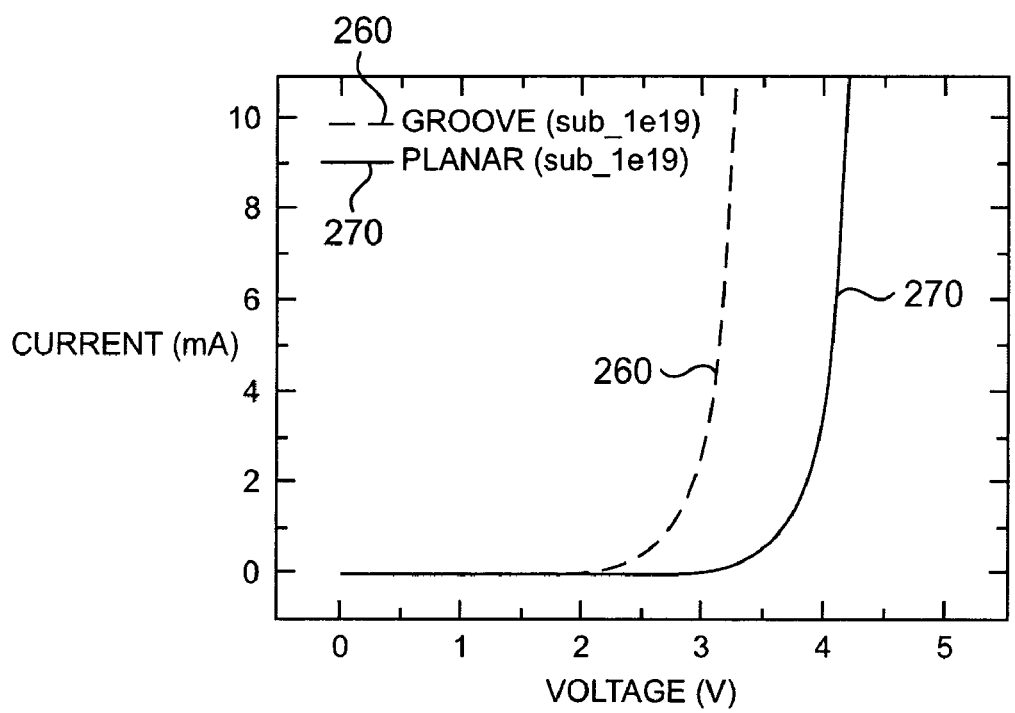
FIGS. 9a and 9b each show voltage-current characteristics for low voltage TVS devices fabricated in accordance with the present invention and for the corresponding planar TVS devices without the provision of a recess or groove.
Figure 9B:
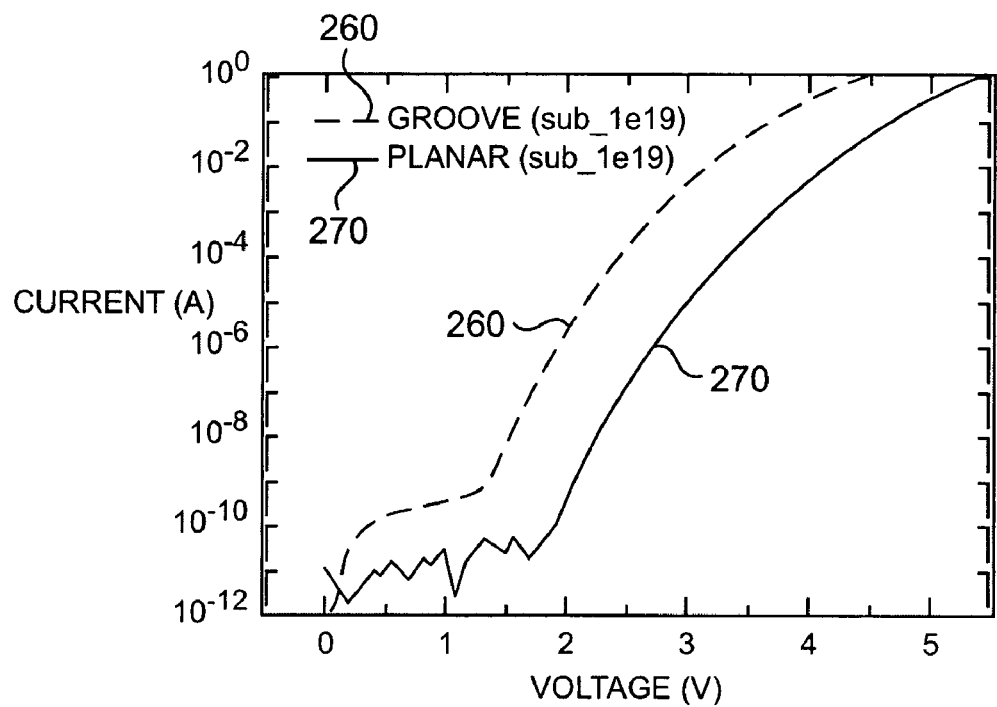

Simulations have confirmed that the breakdown voltage is reduced in the present invention in comparison to the corresponding conventional semiconductor junction device. For instance, FIG. 8 shows the current distribution at the bottom of the recess 210. Because of the enhanced electrical field at this location, the current density is increased. FIGS. 9a and 9b each show voltage-current characteristics for low voltage TVS devices fabricated in accordance with the present invention (curves 260 in FIGS. 9a and 9b) and for the corresponding planar TVS devices without the provision of a recess or groove (curves 270 in FIGS. 9a and 9b). As the figures indicate, the breakdown voltage is lower for the present invention than for corresponding devices formed with at least the same substrate doping concentrations.

Figure 10:
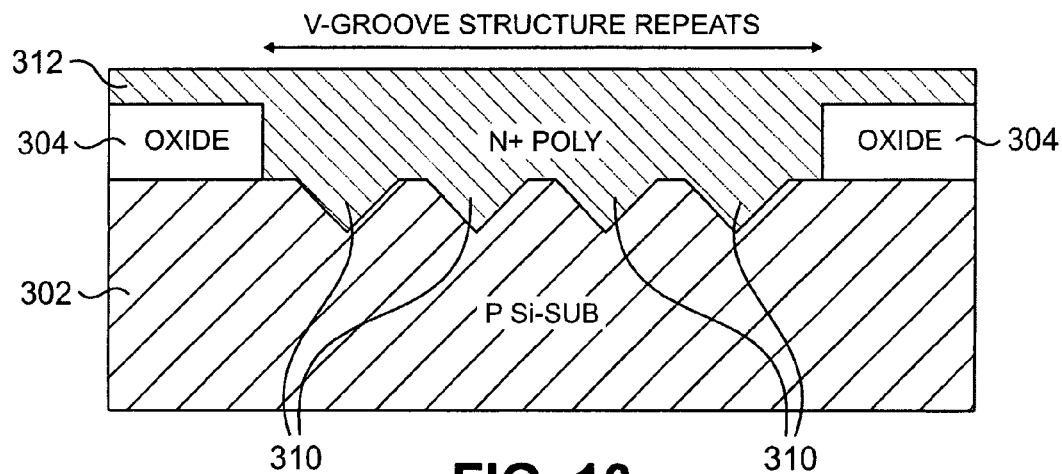
FIGS. 10-18 show another example of semiconductor processing steps that may be used to fabricate a semiconductor junction device in accordance with the present invention.
Figure 11:
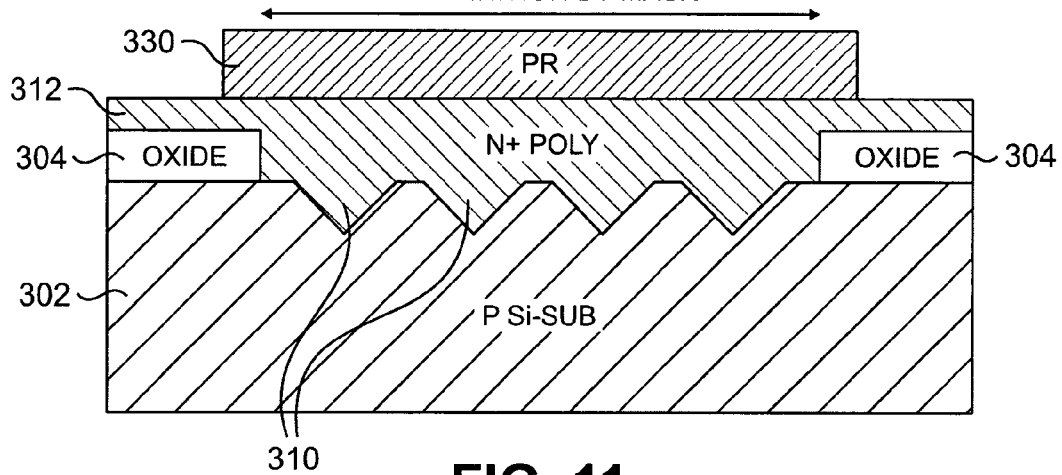
Figure 12:
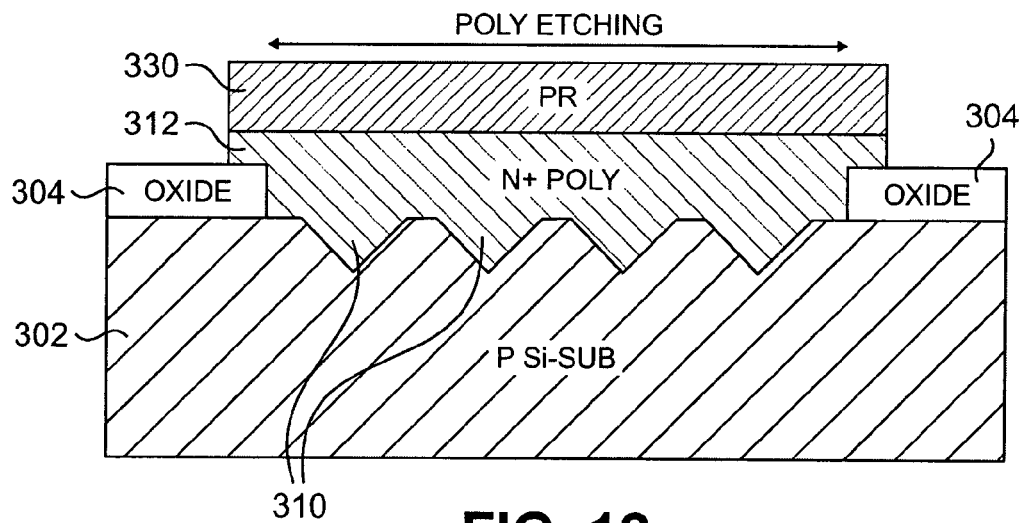
Figure 13:
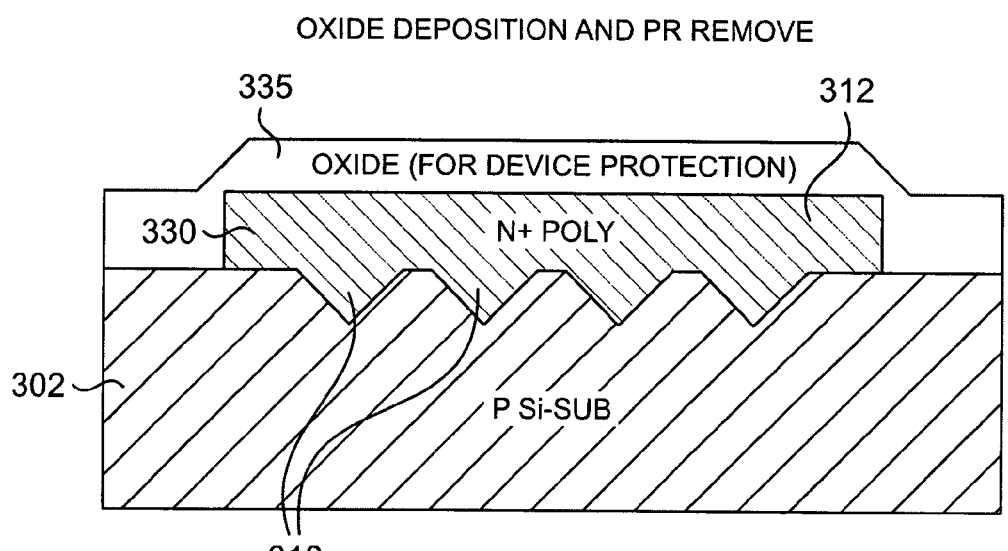
Figure 14:
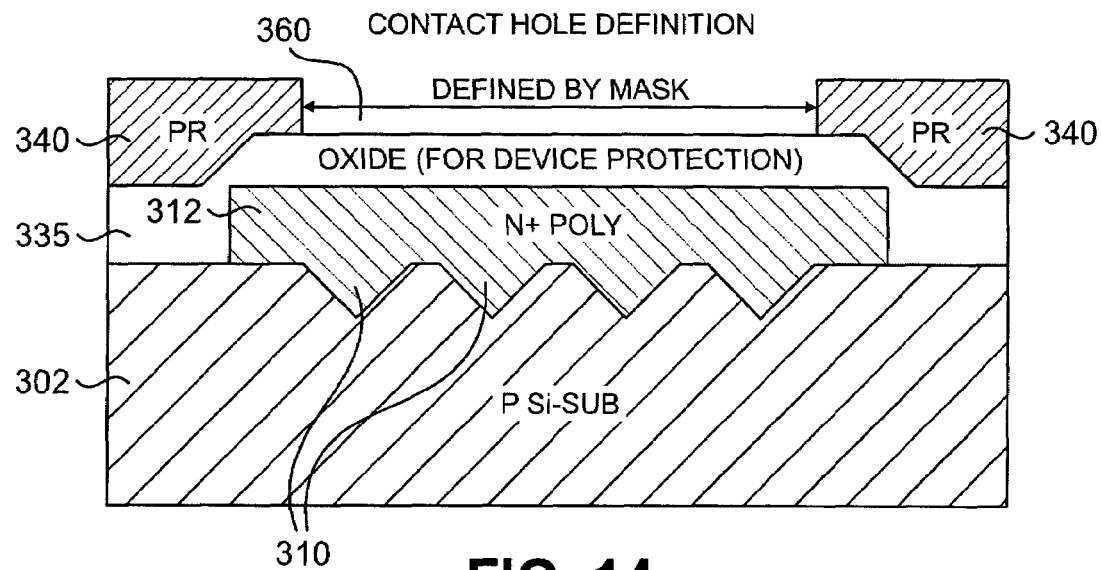
Figure 15:
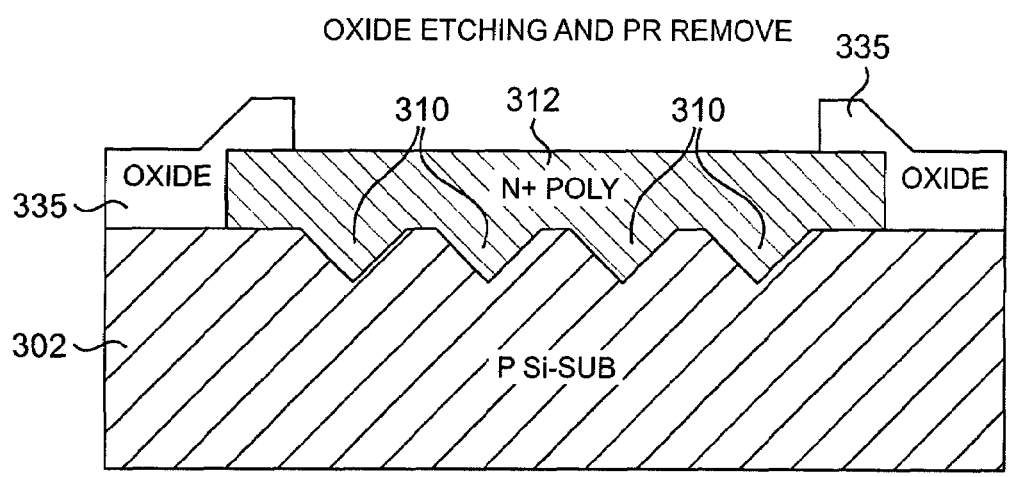
Figure 16:
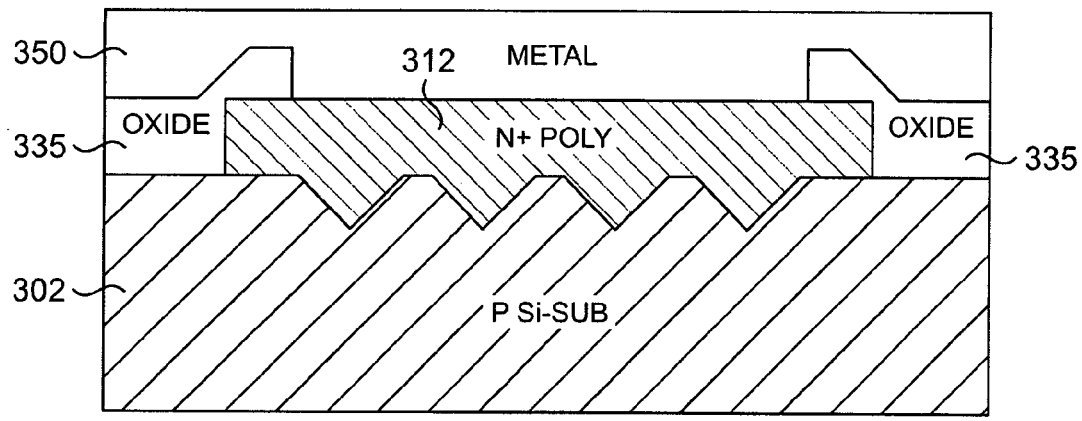
Figure 17:
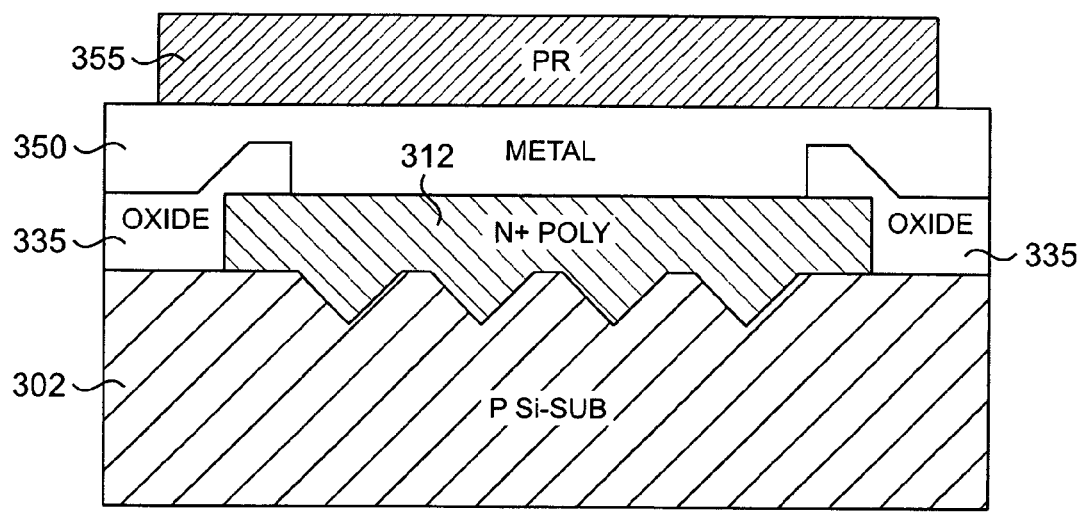
Figure 18:
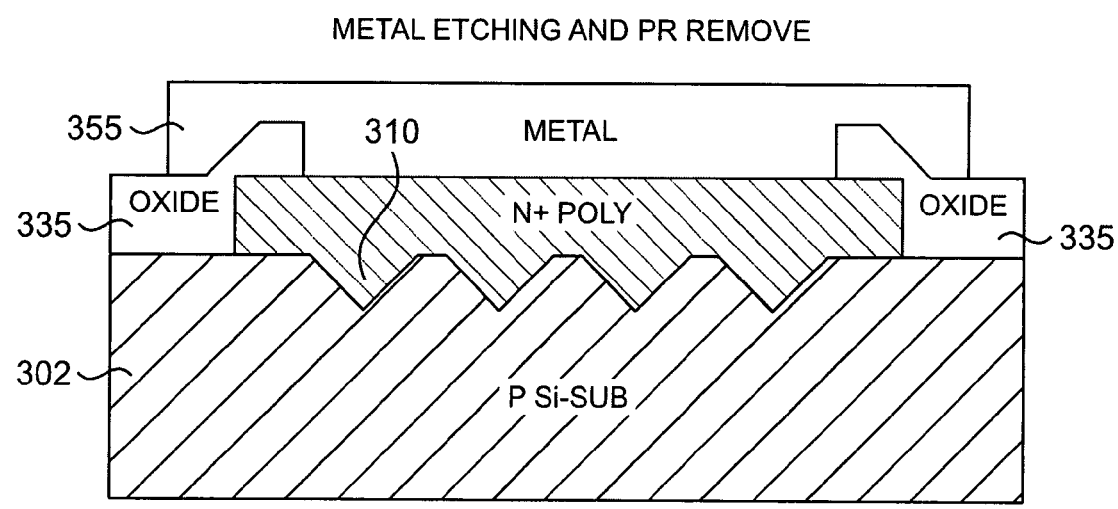

FIGS. 10-18 show another example of semiconductor processing steps that may be used to fabricate a semiconductor junction device in accordance with the present invention. In this example multiple V-type recesses 310 are formed in wafer 202. FIG. 10 shows the device after the heavily doped N+ polysilicon layer 312 is formed, which is similar to the state of the single V-type recess device shown in FIG. 6. In FIG. 11a photoresist mask 330 is applied over the polysilicon layer 312 to facilitate formation of a contact hole. The exposed portion of the polysilicon layer 312 is then etched in FIG. 12 to expose the underlying portions of the oxide layer 304. Next, in FIG. 13 a protective oxide layer 335 is formed over the polysilicon layer 312 and oxide layer 304. A patterned photoresist 340 is then applied in FIG. 14 to define the contact hole 360, after which the oxide 335 is etched and the photoresist removed (FIG. 15). Metallization layer 350 is then deposited in FIG. 16 to fill contact hole 360. In FIG. 17 a photoresist 355 is applied over the metallization layer 350 to define a metal PAD region. The metallization layer 350 is etched and the photoresist 355 removed in FIG. 18, thus completing the device as shown.

The invention claimed is:

1. A semiconductor junction device, comprising:
a substrate of low resistivity semiconductor material having a preselected polarity;
a tapered recess extending into the substrate and tapering inward as it extends downward from an upper surface of the substrate, wherein the tapered recess is a V-groove;
a semiconductor layer disposed within the recess and extending above the upper surface of the substrate, said semiconductor layer having a polarity opposite from that of the substrate, wherein said semiconductor layer is formed by first depositing a layer of undoped polysilicon, implanting a dopant having a polarity opposite to that of the substrate into the polysilicon layer, and using an anneal process to diffuse the dopant into said substrate, such that an electrical field at the bottom tip of the tapered recess is enhanced to lower the breakdown voltage of the device, and wherein said semiconductor layer covers an oxide layer used to form a mask to create the tapered recess; and
a metal layer overlying the semiconductor layer.

2. The semiconductor junction device of claim 1 wherein the substrate comprises a silicon substrate.

3. The semiconductor junction device of claim 1 wherein the substrate has a [100] surface orientation.

4. The semiconductor junction device of claim 1 wherein the semiconductor layer comprises a polysilicon layer.

5. A method of forming a semiconductor junction device, comprising:

forming an oxide layer over the upper surface of a substrate of low resistivity semiconductor material having a preselected polarity and etching an aperture in the oxide layer;

forming a tapered recess in the substrate, said recess tapering inward as it extends downward from an upper surface of the substrate, wherein the tapered recess is a V-groove;

forming a semiconductor layer within the recess and extending above the upper surface of the substrate to cover said oxide layer, said semiconductor layer having a polarity opposite from that of the substrate, wherein the step of forming the semiconductor layer comprises:

depositing a semiconductor material;

implanting into the semiconductor material a dopant having the polarity opposite from that of the substrate; and diffusing the dopant into the semiconductor substrate by annealing the semiconductor material and forming a metal layer overlying the semiconductor layer, wherein said semiconductor layer covers said oxide layer during said step of forming a metal layer.

6. The method of claim 5 further comprising anisotropically etching the tapered recess in the substrate.

7. The method of claim 6 wherein the substrate comprises a silicon substrate.

8. The method of claim 7 wherein the silicon substrate has a [100] surface orientation.

9. The method of claim 5 wherein the semiconductor material is polysilicon.

* * * * *